US012580032B2

(12) United States Patent
Kim

(10) Patent No.: US 12,580,032 B2
(45) Date of Patent: Mar. 17, 2026

(54) READ OPERATIONS WITH OFFSET FOR SLOW CHARGE LOSS

(71) Applicant: Micron Technology, Inc., Boise, ID (US)

(72) Inventor: Kyungjin Kim, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 18/679,956

(22) Filed: May 31, 2024

(65) Prior Publication Data

US 2024/0404610 A1     Dec. 5, 2024

Related U.S. Application Data

(60) Provisional application No. 63/470,272, filed on Jun. 1, 2023.

(51) Int. Cl.
| | |
|---|---|
| *G11C 7/00* | (2006.01) |
| *G11C 16/04* | (2006.01) |
| *G11C 16/26* | (2006.01) |
| *G11C 16/34* | (2006.01) |

(52) U.S. Cl.
CPC ........ *G11C 16/349* (2013.01); *G11C 16/0483* (2013.01); *G11C 16/26* (2013.01)

(58) Field of Classification Search
CPC ....... G11C 7/1051; G11C 7/22; G11C 7/1072; G11C 7/1006; G11C 7/1066
USPC ...................................... 365/189.15
See application file for complete search history.

(56) References Cited

U.S. PATENT DOCUMENTS

| | | |
|---|---|---|
| 2018/0033490 A1 | 2/2018 | Marelli et al. |
| 2019/0004734 A1 | 1/2019 | Kirshenbaum et al. |
| 2019/0042356 A1 | 2/2019 | Chen et al. |
| 2019/0102097 A1* | 4/2019 | Madraswala .......... G11C 16/26 |
| 2019/0130966 A1 | 5/2019 | Danjean et al. |

* cited by examiner

*Primary Examiner* — Son T Dinh
(74) *Attorney, Agent, or Firm* — Brooks, Cameron & Huebsch, PLLC

(57)     ABSTRACT
Apparatuses and methods for performing read operations using an offset based upon slow charge loss characteristics are provided. One example apparatus can include a controller configured to apply a read voltage to a word line in the array of memory cells during a read operation on the word line, wherein the read voltage includes an offset associated with a slow charge loss characteristic of the word line.

20 Claims, 5 Drawing Sheets

309

307

WLT READ  - 330-1

315  $V_S$ ~332

305-N  $V_{pass}$ r ~334

305-(N-1)  $V_{pass}$ r ~334

305-(T+2)

305-(T+1)  $V_{pass}$ r ~334

305-T  $V_{WLRV}$ ~338

305-(T-1)  $V_{pass}$ r ~334

305-(T-2)  $V_{pass}$ r ~344

305-2  $V_{pass}$ r ~344

305-1  $V_{pass}$ r ~344

317  $V_S$ ~332

| | RD Lvl1 OFFSET (442-1) | RD Lvl2 OFFSET (442-2) | RD Lvl3 OFFSET (442-3) | RD Lvl4 OFFSET (442-4) | RD Lvl5 OFFSET (442-5) | RD Lvl6 OFFSET (442-6) | RD Lvl7 OFFSET (442-7) |
|---|---|---|---|---|---|---|---|
| WLG-1 (444-1) | -3 | -2 | -1 | -4 | -3 | -5 | -6 |
| WLG-2 (444-2) | 2 | 1 | 3 | 1 | 4 | 6 | 5 |
| WLG-3 (444-3) | 0 | 0 | -1 | 1 | 0 | -1 | -3 |
| | . | . | . | . | . | . | . |
| | . | . | . | . | . | . | . |
| | . | . | . | . | . | . | . |
| WLG-R (444-R) | 5 | 4 | 2 | 0 | -3 | -6 | -10 |

Fig. 4

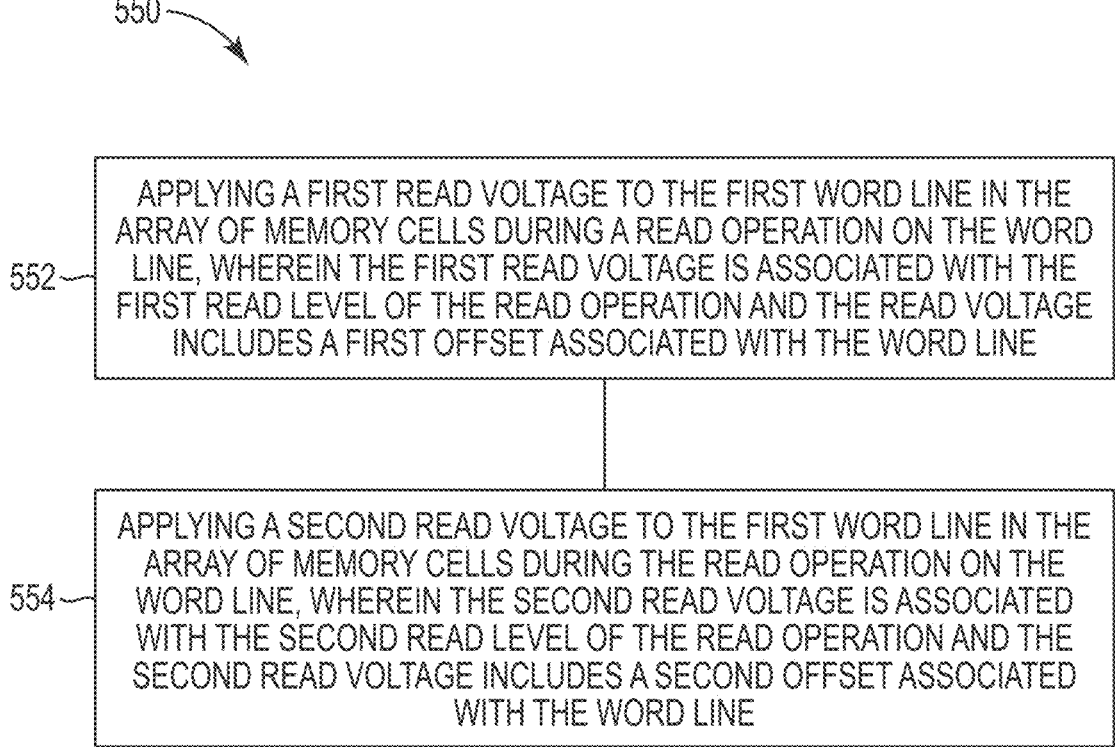

550

552 — APPLYING A FIRST READ VOLTAGE TO THE FIRST WORD LINE IN THE ARRAY OF MEMORY CELLS DURING A READ OPERATION ON THE WORD LINE, WHEREIN THE FIRST READ VOLTAGE IS ASSOCIATED WITH THE FIRST READ LEVEL OF THE READ OPERATION AND THE READ VOLTAGE INCLUDES A FIRST OFFSET ASSOCIATED WITH THE WORD LINE

554 — APPLYING A SECOND READ VOLTAGE TO THE FIRST WORD LINE IN THE ARRAY OF MEMORY CELLS DURING THE READ OPERATION ON THE WORD LINE, WHEREIN THE SECOND READ VOLTAGE IS ASSOCIATED WITH THE SECOND READ LEVEL OF THE READ OPERATION AND THE SECOND READ VOLTAGE INCLUDES A SECOND OFFSET ASSOCIATED WITH THE WORD LINE

Fig. 5

READ OPERATIONS WITH OFFSET FOR SLOW CHARGE LOSS

PRIORITY INFORMATION

This application claims the benefits of U.S. Provisional Application No. 63/470,272, filed on Jun. 1, 2023, the contents of which are incorporated herein by reference.

TECHNICAL FIELD

The present disclosure relates generally to read operations, and more particularly, to apparatuses and methods for read operations with offset for slow charge loss.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory, e.g., NAND flash memory and/or NOR flash memory, and/or can include volatile memory, e.g., DRAM and/or SRAM, among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory cells in an array architecture can be programmed to a desired state. For instance, electric charge can be placed on or removed from the charge storage structure, e.g., floating gate, of a memory cell to program the cell to a particular state. For example, a single level (memory) cell (SLC) can be programmed to one of two different states, each representing a different digit of a data value, e.g., a 1 or 0. Some flash memory cells can be programmed to one of more than two states corresponding to different particular data values, e.g., 1111, 0111, 0011, 1011, 1001, 0001, 0101, 1101, 1100, 0100, 0000, 1000, 1010, 0010, 0110, or 1110. Such cells may be referred to as multi state memory cells, multiunit cells, or multilevel (memory) cells (MLCs). MLCs can provide higher density memories without increasing the number of memory cells since each cell can be programmed to states corresponding to more than one digit, e.g., more than one bit of data.

BRIEF DESCRIPTION OF THE DRAWINGS

FIG. 4 is a diagram illustrating a look up table (LUT) that stores offsets for read operations in accordance with a number of embodiments of the present disclosure.

FIG. 5 is a flow diagram a method for operating a controller configured for read operations with offset for slow charge loss in accordance with a number of embodiments of the present disclosure.

DETAILED DESCRIPTION

Figure 1:
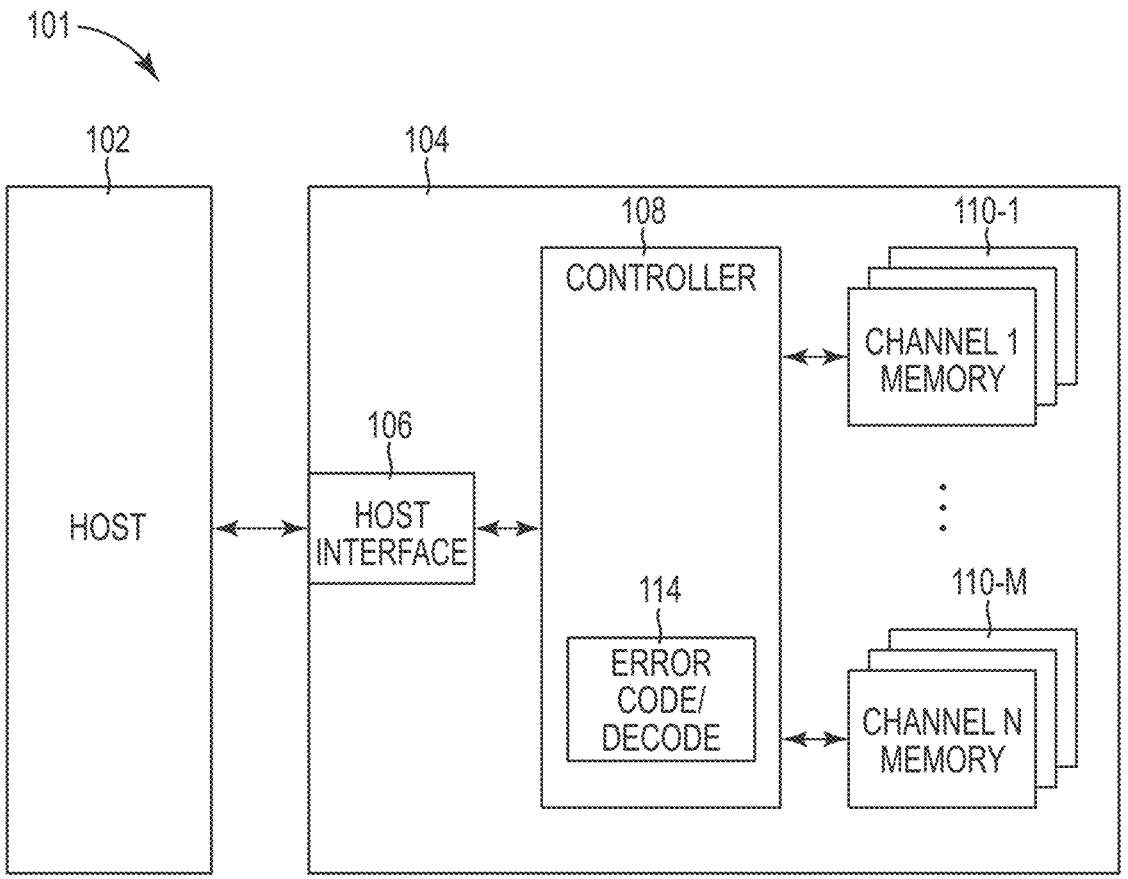
FIG. 1 is a block diagram of an apparatus in the form of a computing system including at least one memory system in accordance with a number of embodiments of the present disclosure.

The present disclosure provides apparatuses and methods for performing read operations using an offset based upon slow charge loss characteristics are provided. One example apparatus can include a controller configured to apply a read voltage to a word line in the array of memory cells during a read operation on the word line, wherein the read voltage includes an offset associated with a slow charge loss characteristic of the word line.

When reading memory cells, errors can occur that are caused by slow charge loss in the memory cells. Embodiments of the present disclosure can reduce these errors by including an offset in the read voltages used during read operations. The offsets can be determined for word line groups that have similar and/or common slow charge loss characteristics, such that offsets for read voltages at each read level are applied to the word lines in a word line group. Offsets are determined for each word line group such that the errors associated with slow charge loss can be reduced on the word line level. For example, a word line group can include a single word line when that single word line has slow charge loss characteristics that are different from the other word lines.

In a number of embodiments, the offsets associated with the slow charge loss for each word line group can be stored in a look up table (LUT) in the array of memory cells and/or in the controller. The slow charge loss characteristic that the offsets are based on can include edge sum (ESUM) loss at end of life (EOL) and/or center shift at EOL for the word line.

In a number of embodiments, the offset can be included in read voltages when performing read operations by executing a read command associated with the read operation. The offset can also be included in read voltages when performing read operations by executing a command, in addition to the read command, to apply the offset to the read voltage.

In a number of embodiments, the offset can be included in read operations prior to any errors occurring during the read operations (e.g., a first read operation in response to receiving a read request). The offset can also be included in read operations in response to errors occurring, such as part of an error recovery step (ERS) operation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first bit or bits correspond to the drawing figure number and the remaining bits identify an element or component in the drawing. Similar elements or components between different figures may be identified by the use of similar bits. For example, 100 may reference element "00" in FIG. 1, and a similar element may be referenced as 600 in FIG. 6. Elements shown in the various embodiments herein can be added, exchanged, and/or eliminated so as to provide a number of additional embodiments of the present disclosure. In addition, the proportion and the relative scale of the elements provided in the figures are intended to illustrate the embodiments of the present disclosure and should not be taken in a limiting sense.

FIG. 1 is a block diagram of an apparatus in the form of a computing system 101 including at least one memory system 104 in accordance with a number of embodiments of the present disclosure. As used herein, a memory system 104, a controller 108, or a memory device 110 might also be separately considered an "apparatus". The memory system 104 can be a solid state drive (SSD), for instance, and can include a host interface 106, a controller 108, e.g., a processor and/or other control circuitry, and a number of memory devices 110-1, . . . , 510-M, e.g., solid state memory devices such as NAND flash devices, which provide a storage volume for the memory system 104. In a number of embodiments, the controller 108, a memory device 110-1 to 110-M, and/or the host interface 106 can be physically located on a single die or within a single package, e.g., a managed NAND application. Also, in a number of embodiments, a memory, e.g., memory devices 110-1 to 110-M, can include a single memory device.

As illustrated in FIG. 1, the controller 108 can be coupled to the host interface 106 and to the memory devices 110-1, . . . , 110-M via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices, e.g., a number of processors.

The controller 108 can communicate with the memory devices 110-1, . . . , 110-M to control data read, write, and erase operations, among other operations. The controller 108 can include, for example, a number of components in the form of hardware and/or firmware, e.g., one or more integrated circuits, and/or software for controlling access to the number of memory devices 110-1, . . . , 110-M and/or for facilitating data transfer between the host 102 and memory devices 110-1, . . . , 110-M. For instance, in the example illustrated in FIG. 1, controller 108 includes an error correcting code encoder/decode component 114. However, controller 108 can include various other components not illustrated so as not to obscure embodiments of the present disclosure. Also, component 114 may not be components of controller 108, in some embodiments, e.g., component 114 can be independent components.

The error correcting code encoder/decode component 114 can be an LDPC encoder/decoder, for instance, which can encode/decode user data transferred between host 102 and the memory devices 110-1, . . . , 110-M.

The memory devices 110-1, . . . , 110-M can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

Figure 2:
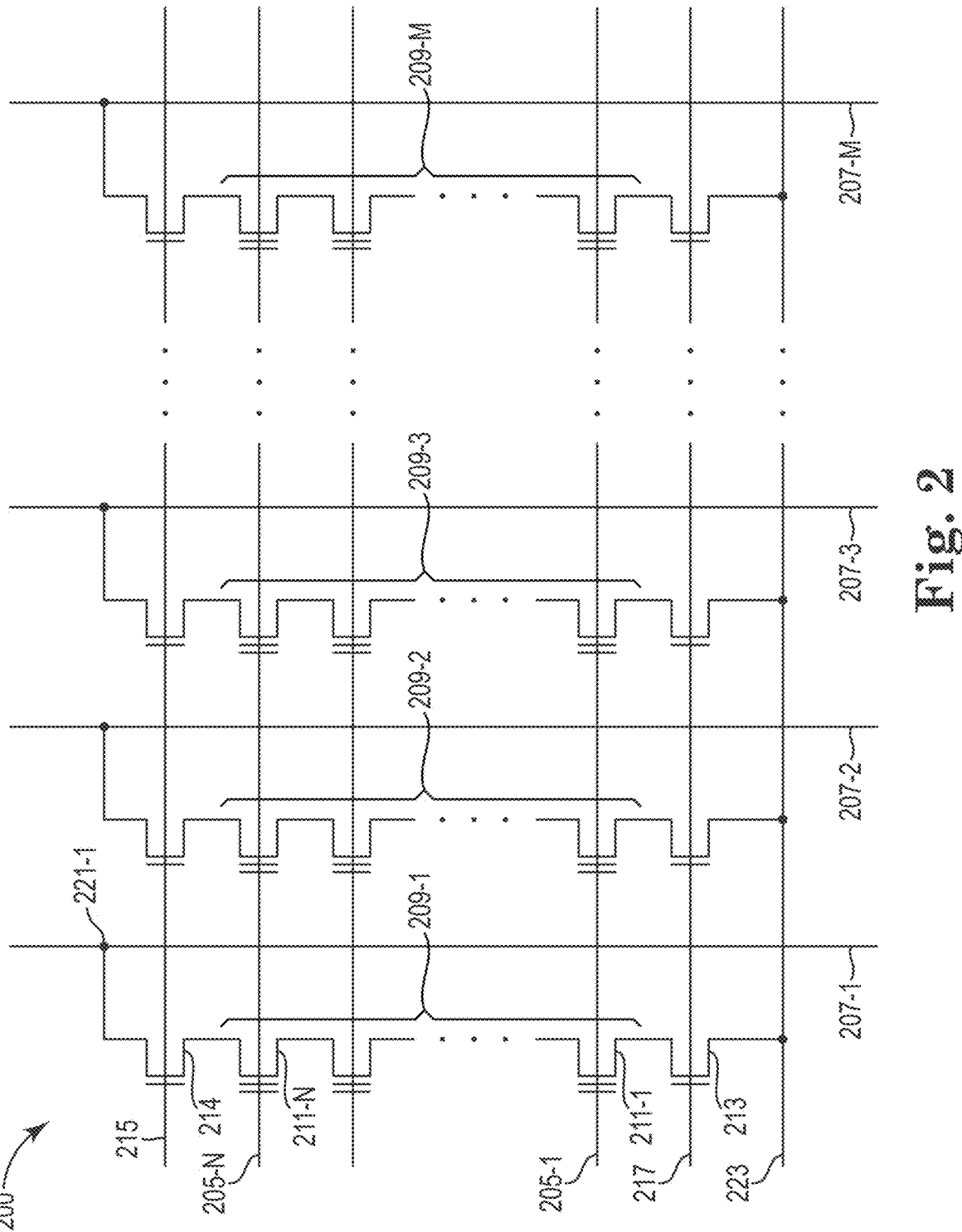
FIG. 2 illustrates a schematic diagram of a portion of a non-volatile memory array in accordance with a number of embodiments of the present disclosure.

FIG. 2 illustrates a schematic diagram of a portion of a non-volatile memory array 200 in accordance with a number of embodiments of the present disclosure. The embodiment of FIG. 2 illustrates a NAND architecture non-volatile memory array, e.g., NAND Flash. However, embodiments described herein are not limited to this example. As shown in FIG. 2, memory array 200 includes access lines, e.g., word lines 205-1, . . . , 205-N, and intersecting data lines, e.g., local bit lines, 207-1, 207-2, 207-3, . . . , 207-M. For ease of addressing in the digital environment, the number of word lines 205-1, . . . , 205-N and the number of local bit lines 207-1, 207-2, 207-3, . . . , 207-M can be some power of two, e.g., 256 word lines by 4,096 bit lines.

Memory array 200 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The non-volatile memory cells 211-1, . . . , 211-N of each NAND string 209-1, 209-2, 209-3, . . . , 209-M are connected in series source to drain between a source select gate (SGS), e.g., a field-effect transistor (FET), 213, and a drain select gate (SGD), e.g., FET, 214. Each source select gate 213 is configured to selectively couple a respective NAND string to a common source 223 responsive to a signal on source select line 217, while each drain select gate 214 is configured to selectively couple a respective NAND string to a respective bit line responsive to a signal on drain select line 215.

As shown in the embodiment illustrated in FIG. 2, a source of source select gate 213 is connected to a common source line 223. The drain of source select gate 213 is connected to the source of the memory cell 211-1 of the corresponding NAND string 209-1. The drain of drain select gate 214 is connected to bit line 207-1 of the corresponding NAND string 209-1 at drain contact 221-1. The source of drain select gate 214 is connected to the drain of the last memory cell 211-N, e.g., a floating-gate transistor, of the corresponding NAND string 409-1.

In a number of embodiments, construction of non-volatile memory cells 211-1, . . . , 211-N includes a source, a drain, a charge storage structure such as a floating gate, and a control gate. Non-volatile memory cells 211-1, . . . , 211-N have their control gates coupled to a word line, 205-1, . . . , 205-N, respectively. A "column" of the non-volatile memory cells, 211-1, . . . , 211-N, make up the NAND strings 209-1, 209-2, 209-3, . . . , 209-M, and are coupled to a given local bit line 207-1, 207-2, 207-3, . . . , 207-M, respectively. A "row" of the non-volatile memory cells are those memory cells commonly coupled to a given word line 205-1, . . . , 205-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

Subsets of cells coupled to a selected word line, e.g., 205-1, . . . , 2105-N, can be programmed and/or read together as a page of memory cells. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, state, e.g., charge storage state. State is equivalently referred to as "level" herein.

A read operation, which can also refer to a program verify operation, can include sensing a voltage and/or current change of a bit line coupled to a selected cell in order to determine the state of the selected cell. The states of a particular fractional bit memory cell may not correspond directly to a data value of the particular memory cell, rather the states of a group of memory cells including the particular memory cell together map to a data value having an integer number of bits. The read operation can include pre-charging a bit line and detecting the discharge when a selected cell begins to conduct.

Determining, e.g., detecting, the state of a selected cell can include providing a number of sensing signals, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be detected to determine whether or not the selected cell conducts in response to the particular sensing signal applied to the selected word line. For example, the state of a selected cell can be determined by the word line voltage at which the bit line current reaches a particular reference current associated with a particular state.

MLCs can be two-bit, e.g., four-state, memory cells, or three-bit, e.g., eight-state, memory cells, or store more than three bits of data per memory cell, including fractional bits of data per memory cell. For example, a two-bit memory cell can be programmed to one of four states, e.g., P0, P1, P2, and P3, respectively. In operation, a number of memory cells, such as in a selected block, can be programmed such that they have a Vt level corresponding to either P0, P1, P2, or P3. As an example, state P0 can represent a stored data value such as binary "11". State P1 can represent a stored data value such as binary "10". State P2 can represent a stored data value such as binary "00". State P3 can represent a stored data value such as binary "01". For example, a three-bit memory cell can be programmed to one of eight states, e.g., P0, P1, P2, P3, P4, P5, P6, or P7, respectively. In operation, a number of memory cells, such as in a selected block, can be programmed such that they have a Vt level corresponding to either P0, P1, P2, P3, P4, P5, P6, or P7. As an example, state P0 can represent a stored data value such as binary "111". State P1 can represent a stored data value such as binary "110". State P2 can represent a stored data value such as binary "101". State P3 can represent a stored data value such as binary "100". State P4 can represent a stored data value such as binary "011". State P5 can represent a stored data value such as binary "010". State P6 can represent a stored data value such as binary "001". State P7 can represent a stored data value such as binary "000". However, embodiments are not limited to these data value correspondence.

Figure 3:
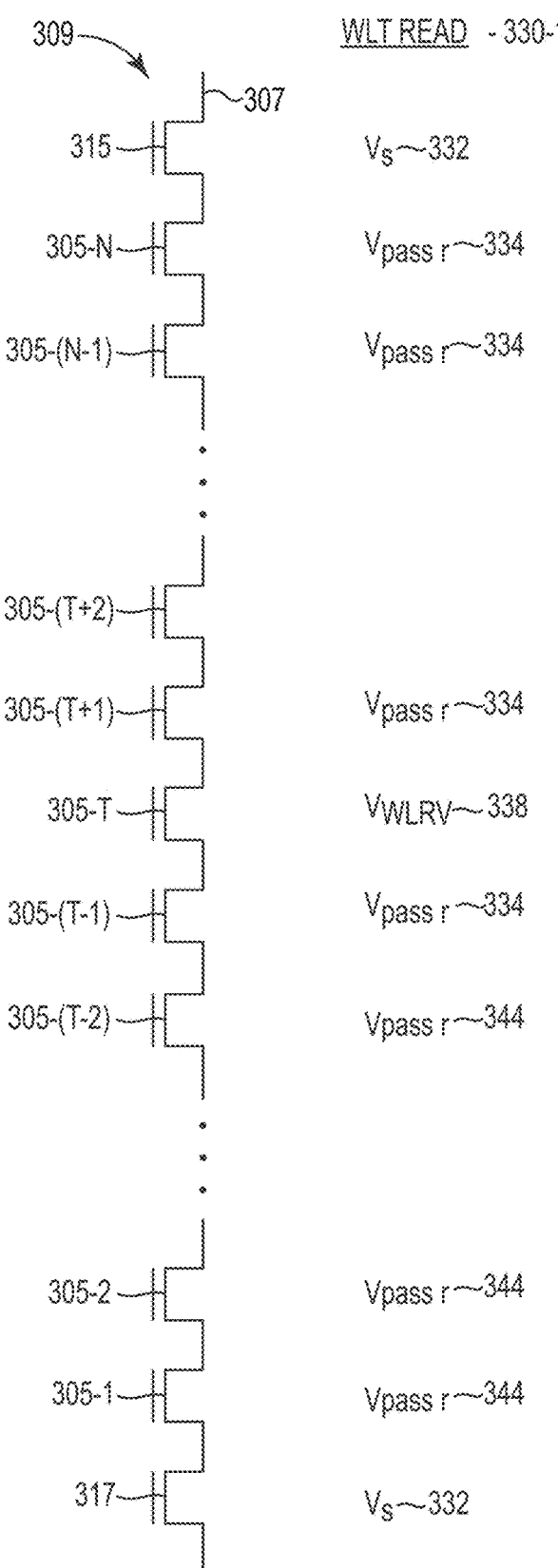
FIG. 3 illustrates a table of operating voltages associated with performing various operations on data memory cells and reference memory cells in accordance with an embodiment of the present disclosure.

FIG. 3 illustrates a table of operating voltages associated with performing various operations on data memory cells and reference memory cells in accordance with an embodiment of the present disclosure. The table illustrates operating voltages, e.g., bias conditions, associated with performing a read operation 330-1 (WLT READ) on one or more data cells coupled to a selected word line, e.g., word line 305-T (WLT) in this example. As shown in the table, the read operation 330-1 performed on the memory cell coupled to selected word line 305-T includes applying a word line read voltage (VWLRV) to the selected word line 305-T.

The read operation 330-1 includes applying a pass through voltage to unselected word lines such that unselected cells in string 309 operate in a conducting mode, e.g., the unselected cells in string 309 are turned on and pass current without regard to the Vt level of the unselected cells.

In this example, drain select line 315 and the source select line 317 are biased at a select voltage Vs 332, e.g., 5V, which is sufficient to turn on the respective drain select gate (SGD) and source select gate (SGS) transistors. Under the biasing conditions shown in the table, voltage and/or current levels on bit line 307 in response to the particular applied word line read voltage (VWLRV) can be sensed by sensing circuitry (not shown) in order to determine a particular state, e.g., state L0, L1, L2, or L3, of the selected data cell 305-T.

FIG. 4 is a diagram illustrating a look up table (LUT) that stores offsets for read operations in accordance with a number of embodiments of the present disclosure.

The LUT in FIG. 4 includes offsets for a number of word line groups, WLG-1 444-1, WLG-2 444-2, WLG-3, 444-3, . . . , WLG-R 444-R. Each of the word line groups, WLG-1 444-1, WLG-2 444-2, WLG-3, 444-3, . . . , WLG-R 444-R can include a number of word lines that have common slow charge loss characteristics such that each word line in a word line group can have the same offset for each read level. For example, WGL-1 444-1 can includes a single word line, WL1, and includes an offset of −3 for read level 1, RD LvL1 442-1, −2 for read level 2, RD LvL2 442-2, −1 for read level 3, RD LvL3 442-3, −4 for read level 4, RD LvL4 442-4, −3 for read level 5, RD LvL5 442-5, −5 for read level 6, RD LvL6 442-6, −6 for read level 7, RD LvL7 442-7. WGL-2 444-2 can include word lines WL2-WL10, and includes an offset of 2 for read level 1, RD LvL1 442-1, 1 for read level 2, RD LvL2 442-2, 3 for read level 3, RD LvL3 442-3, 1 for read level 4, RD LvL4 442-4, 4 for read level 5, RD LvL5 442-5, 6 for read level 6, RD LvL6 442-6, 5 for read level 7, RD LvL7 442-7. WGL-3 444-3 can includes a single word line, WL11, and includes an offset of 0 for read level 1, RD LvL1 442-1, 0 for read level 2, RD LvL2 442-2, −1 for read level 3, RD LvL3 442-3, 1 for read level 4, RD LvL4 442-4, 0 for read level 5, RD LvL5 442-5, −1 for read level 6, RD LvL6 442-6, −3 for read level 7, RD LvL7 442-7. WGL-R 444-R can include word lines WL12-WL80, and includes an offset of 5 for read level 1, RD LvL1 442-1, 4 for read level 2, RD LvL2 442-2, 2 for read level 3, RD LvL3 442-3, 0 for read level 4, RD LvL4 442-4, −3 for read level 5, RD LvL5 442-5, −6 for read level 6, RD LvL6 442-6, −10 for read level 7, RD LvL7 442-7.

FIG. 5 is a flow diagram a method 550 for operating a controller configured for read operations on a partially programmed block in accordance with a number of embodiments of the present disclosure.

At 552, the method can include applying a first read voltage to a first word line in the array of memory cells during a read operation on the word line, wherein the first read voltage is associated with a first read level of the read operation and the read voltage includes a first offset associated with the word line.

At 554, the method can include applying a second read voltage to the first word line in the array of memory cells during the read operation on the word line, wherein the second read voltage is associated with a second read level of the read operation and the second read voltage includes a second offset associated with the word line.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the Detailed Description, with each claim standing on its own as a separate embodiment.

What is claimed is:

1. An apparatus, comprising:
an array of memory cells;
a controller coupled to the array of memory cells and the controller is configured to:
apply a read voltage to a word line in the array of memory cells during a read operation on the word line, wherein the read voltage includes an offset associated with a slow charge loss characteristic of the word line.

2. The apparatus of claim 1, wherein the offset associated with the slow charge loss characteristic of the word line for the read voltage is based upon a read level of the read voltage.

3. The apparatus of claim 1, wherein the offset associated with the slow charge loss for the read voltage is stored in a look up table (LUT) in the array of memory cells.

4. The apparatus of claim 3, wherein the LUT includes offset values for each of a number of word lines in the array of memory cells.

5. The apparatus of claim 3, wherein the LUT includes offset values for each read level of a number read levels used during the read operation.

6. The apparatus of claim 3, wherein the LUT is stored in the array of memory cells.

7. The apparatus of claim 3, wherein the LUT is stored in the controller.

8. The apparatus of claim 1, wherein the slow charge loss characteristic includes edge sum (ESUM) loss at end of life (EOL) for the word line.

9. The apparatus of claim 1, wherein the slow charge loss characteristic includes center shift at end of life (EOL) for the word line.

10. The apparatus of claim 1, wherein the offset is included in the read voltage when executing a read command associated with the read operation.

11. The apparatus of claim 1, wherein the offset is associated with the read voltage in response to executing a command to apply the offset to the read voltage.

12. The apparatus of claim 1, wherein the offset is included in the read voltage during an error recovery step (ERS) operation.

13. The apparatus of claim 1, wherein the offset is included in the read voltage when executing the read operation before the read operation has triggered an error recover step (ERS).

14. An apparatus, comprising:
an array of memory cells; and
a controller coupled to the array of memory cells and the controller is configured to:
apply a first read voltage to a first word line in the array of memory cells during a read operation on the word line, wherein the first read voltage is associated with a first read level of the read operation and the read voltage includes a first offset associated with the word line; and
apply a second read voltage to the first word line in the array of memory cells during the read operation on the word line, wherein the second read voltage is associated with a second read level of the read operation and the second read voltage includes a second offset associated with the word line.

15. The apparatus of claim 14, wherein the first offset and the second offset are associated with a slow charge loss characteristic of the word line.

16. The apparatus of claim 14, wherein the first read level and the second read level are associated with reading a lower page of the word line.

17. The apparatus of claim 14, wherein the first read level and the second read level are associated with reading an upper page of the word line.

18. A method, comprising:

performing a read operation upon a word line in a memory array wherein performing the read operation includes:

applying a first read voltage to a first word line in the array of memory cells during a read operation on the word line, wherein the first read voltage is associated with a first read level of the read operation and the read voltage includes a first offset associated with the word line; and applying a second read voltage to the first word line in the array of memory cells during the read operation on the word line, wherein the second read voltage is associated with a second read level of the read operation and the second read voltage includes a second offset associated with the word line.

19. The method of claim 18, further including locating the first offset and the second offset in a look up table (LUT).

20. The method of claim 18, further including determining the first offset and the second offset based upon a slow charge loss characteristic of the word line.

\* \* \* \* \*